US008772622B2

(12) United States Patent
Haass

(10) Patent No.: US 8,772,622 B2
(45) Date of Patent: Jul. 8, 2014

(54) DOPED TIN TELLURIDES FOR THERMOELECTRIC APPLICATIONS

(75) Inventor: Frank Haass, Erzhausen (DE)

(73) Assignee: BASF SE, Ludwigshafen (DE)

( * ) Notice: Subject to any disclaimer, the term of this patent is extended or adjusted under 35 U.S.C. 154(b) by 700 days.

(21) Appl. No.: 12/866,552

(22) PCT Filed: Feb. 5, 2009

(86) PCT No.: PCT/EP2009/051298
§ 371 (c)(1),
(2), (4) Date: Aug. 6, 2010

(87) PCT Pub. No.: WO2009/098248
PCT Pub. Date: Aug. 13, 2009

(65) Prior Publication Data
US 2011/0012069 A1    Jan. 20, 2011

(30) Foreign Application Priority Data
Feb. 7, 2008 (EP) .................................... 08151149

(51) Int. Cl.
*H01L 35/16* (2006.01)

(52) U.S. Cl.
USPC .... 136/238; 136/236.1; 136/239; 252/62.3 T; 252/62.3 V

(58) Field of Classification Search
USPC ........... 136/236.1, 238, 239, 241; 252/62.3 T
See application file for complete search history.

(56) References Cited

U.S. PATENT DOCUMENTS

| 3,880,674 | A | * | 4/1975 | Saunders ...................... 136/237 |
| 4,076,572 | A | | 2/1978 | Kimura |
| 5,439,528 | A | | 8/1995 | Miller |
| 5,448,109 | A | | 9/1995 | Cauchy |
| 2004/0107988 | A1 | * | 6/2004 | Harman et al. ............... 136/205 |
| 2005/0284512 | A1 | | 12/2005 | Heremans et al. |
| 2007/0107764 | A1 | * | 5/2007 | Kanatzidis et al. ........... 136/205 |
| 2009/0038719 | A1 | | 2/2009 | Boettner et al. |
| 2009/0084422 | A1 | * | 4/2009 | Haass .......................... 136/204 |
| 2010/0327258 | A1 | * | 12/2010 | Lee et al. ........................ 257/14 |
| 2011/0306261 | A1 | | 12/2011 | Haaβ |

FOREIGN PATENT DOCUMENTS

| EP | 1 102 334 | 5/2001 |
| JP | 2006 19355 | 1/2006 |
| WO | 98 44562 | 10/1998 |

(Continued)

OTHER PUBLICATIONS

U.S. Appl. No. 13/259,872, filed Sep. 23, 2011, Stefan et al.

(Continued)

*Primary Examiner* — Jayne Mershon
(74) *Attorney, Agent, or Firm* — Oblon, Spivak, McClelland, Maier & Neustadt, L.L.P.

(57) ABSTRACT

The p- or n-conductive semiconductor material comprises a compound of the general formula (I)

$$Sn_aPb_{1-a-(x1+\ldots+xn)}A^1_{x1}\ldots A^n_{xn}(Te_{1-p-q-r}Se_pS_qX_r)_{1+z} \quad (I)$$

where
0.05<a<1
n≥1 where n is the number of chemical elements different than Sn and Pb
in each case independently
1 ppm≤x1 . . . xn≤0.05
$A^1 \ldots A^n$ are different from one another and are selected from the group of the elements Li, Na, K, Rb, Cs, Mg, Ca, Y, Ti, Zr, Hf, Nb, Ta, Cr, Mn, Fe, Cu, Ag, Au, Ga, In, Tl, Ge, Sb, Bi
X is F, Cl, Br or I
0≤p≤1
0≤q≤1
0≤r≤0.01
−0.01≤z≤0.01
with the condition that p+q+r≤1 and a+x1+ . . . +xn≤1.

15 Claims, 2 Drawing Sheets

(56) References Cited

FOREIGN PATENT DOCUMENTS

| WO | 2006 133930 | | 12/2006 |
|---|---|---|---|
| WO | 2007 104601 | | 9/2007 |
| WO | 2007 104603 | | 9/2007 |
| WO | WO 2007/104601 | * | 9/2007 |

OTHER PUBLICATIONS

International Search Report issued Dec. 8, 2009 in PCT/EP09/051298 filed Feb. 5, 2009.

Lee, S. K. et al., "Thermoelectric Properties of the Hot-Pressed (Pb0.75n0.3) Te With Addition of Na2Te", Journal of the Korean Institute of Metals and Materials Korean Inst. Metals & Mater, vol. 37, No. 3, Total Pages 2, XP 002553054, Database accession No. 6293475, ISSN: 0253-3847 (Mar. 1999) (English abstract only).

Nemov, S. A. et al., "Characteristics of the Energy Spectrum of Pb1-xSnxTe: Tl, Na", Soviet Physics—Semiconductors, vol. 24, No. 8, Total Pages 2, XP 002553055, Database accession No. 3874115, ISSN: 0038-5700, (Aug. 1990) (abstract only).

Vahanyan, A. I. et al., "On Thermoelectric Figure-of Merit of $Pb_{0.78}Sn_{022}$ Te (Ge)Solid Solution", Journal of Alloys and Compounds, vol. 463, pp. 480-483, XP 002553052, (Sep. 21, 2007).

Rowe, D. M. et al., "Preparation of High-Density Small Grain Size Compacts of Lead Tin Telluride", Journal of Materials Science: Materials in Electronics, vol. 1, pp. 129-132, XP 002553053 (1990).

* cited by examiner

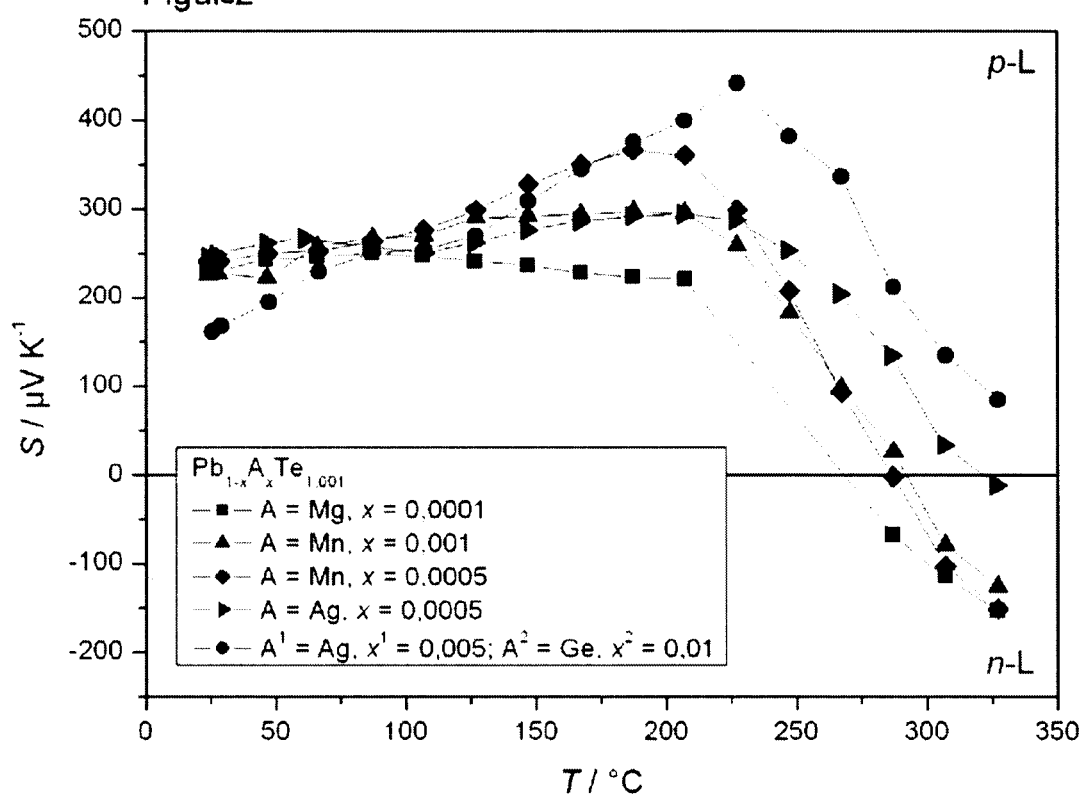

DOPED TIN TELLURIDES FOR THERMOELECTRIC APPLICATIONS

BACKGROUND OF THE INVENTION

1. Field of the Invention

The present invention relates to semiconductor materials comprising tin and generally tellurium, and also at least one or two further dopants, and to thermoelectric generators and Peltier arrangements comprising said materials.

2. Description of the Background

Thermoelectric generators and Peltier arrangements as such have been known for some time. p- and n-doped semiconductors which are heated on one side and cooled on the other side transport electrical charges through an external circuit, and electrical work can be performed by a load in the circuit. The efficiency of conversion of heat to electrical energy achieved in this process is limited thermodynamically by the Carnot efficiency. Thus, at a temperature of 1000 K on the hot side and 400K on the "cold" side, an efficiency of (1000-400): 1000=60% would be possible. However, only efficiencies of up to 10% have been achieved to date.

On the other hand, when a direct current is applied to such an arrangement, heat is transported from one side to the other side. Such a Peltier arrangement works as a heat pump and is therefore suitable for cooling apparatus parts, vehicles or buildings. Heating via the Peltier principle is also more favorable than conventional heating, because more heat is always transported than corresponds to the energy equivalent supplied.

A good review of effects and materials is given, for example, by Cronin B. Vining, ITS Short Course on Thermoelectricity, Nov. 8, 1993, Yokohama, Japan.

At present, thermoelectric generators are used, for example, in space probes for generating direct currents, for cathodic corrosion protection of pipelines, for energy supply to light buoys and radio buoys and for operating radios and television sets. The advantages of thermoelectric generators lie in their extreme reliability. For instance, they work irrespective of atmospheric conditions such as atmospheric moisture; there is no fault-prone mass transfer, but rather only charge transfer. It is possible to use any fuels from hydrogen through natural gas, gasoline, kerosene, diesel fuel up to biologically obtained fuels such as rapeseed oil methyl ester.

Thermoelectric energy conversion thus fits extremely flexibly into future requirements such as hydrogen economy or energy generation from renewable energies.

A particularly attractive application is the use for converting (waste) heat to electrical energy in motor vehicles, heating systems or power plants. Thermal energy unutilized to date can even now by recovered at least partly by thermoelectric generators, but existing technologies achieve efficiencies of significantly below 10%, and so a large part of the energy is still lost unutilized. In the utilization of waste heat, there is therefore also a drive toward significantly higher efficiencies.

The conversion of solar energy directly to electrical energy would also be very attractive. Concentrators such as parabolic troughs can concentrate solar energy into thermoelectric generators, which generates electrical energy.

However, higher efficiencies are also needed for use as a heat pump.

Thermoelectrically active materials are rated essentially with reference to their efficiency. A characteristic of thermoelectric materials in this regard is what is known as the Z factor (figure of merit):

$$Z = \frac{S^2 \cdot \sigma}{\kappa}$$

with the Seebeck coefficient S, the electrical conductivity $\sigma$ and the thermal conductivity $\kappa$. Preference is given to thermoelectric materials which have a very low thermal conductivity, a very high electrical conductivity and a very large Seebeck coefficient, such that the figure of merit assumes a maximum value.

The product $S^2\sigma$ is referred to as the power factor and serves for comparison of the thermoelectric materials.

In addition, the dimensionless product Z·T is often also reported for comparative purposes. Thermoelectric materials known hitherto have maximum values of Z·T of about 1 at an optimal temperature. Beyond this optimal temperature, the values of Z·T are often significantly lower than 1.

A more precise analysis shows that the efficiency $\eta$ is calculated from $$\eta = \frac{T_{high} - T_{low}}{T_{high}} \frac{M-1}{M + \frac{T_{low}}{T_{high}}}$$

where $$M = \left[1 + \frac{Z}{2}(T_{high} + T_{low})\right]^{\frac{1}{2}}$$

(see also Mat. Sci. and Eng. B29 (1995) 228).

The aim is thus to provide a thermoelectric material having a maximum value of Z and a high realizable temperature differential. From the point of view of solid state physics, many problems have to be overcome here:

A high $\sigma$ requires a high electron mobility in the material, i.e. electrons (or holes in p-conducting materials) must not be bound strongly to the atomic cores. Materials having high electrical conductivity $\sigma$ usually simultaneously have a high thermal conductivity (Wiedemann-Franz law), which does not allow Z to be favorably influenced. Materials used at present, such as $Bi_2Te_3$, already constitute compromises. For instance, the electrical conductivity is lowered to a lesser extent by alloying than the thermal conductivity. Preference is therefore given to using alloys, for example $(Bi_2Te_3)_{90}(Sb_2Te_3)_5(Sb_2Se_3)_5$ or $Bi_{12}Sb_{23}Te_{65}$, as described in U.S. Pat. No. 5,448,109.

For thermoelectric materials having high efficiency, still further boundary conditions preferably have to be fulfilled. For instance, they have to be sufficiently thermally stable to be able to work under operating conditions over the course of years without significant loss of efficiency. This requires a phase which is thermally stable at high temperatures per se, a stable phase composition, and negligible diffusion of alloy constituents into the adjoining contact materials.

Doped lead tellurides for thermoelectric applications are described, for example, in WO 2007/104601. These are lead tellurides which, as well as a majority of lead, also comprise one or two further dopants. The particular proportion of the dopants, based on the formula (I) specified in the WO, is from 1 ppm to 0.05. Example 5 discloses $Pb_{0.987}Ge_{0.01}Sn_{0.003}Te_{1.001}$. This material actually includes the lowest lead content of the illustrative compounds. The materials thus have very high lead contents and only very low tin contents, if any.

WO 2007/104603 relates to lead germanium tellurides for thermoelectric applications.

These are ternary compounds of lead, germanium and tellurium, in which very high lead contents are again present.

For the production of a thermoelectric module, n- and p-conductors are always necessary. In order to arrive at a maximum efficiency of the module, i.e. at a maximum cooling performance in the case of a Peltier arrangement or a maximum generator performance in the case of a Seebeck arrangement, p-conductive and n-conductive material must be as well matched to one another as possible. This relates in particular to the parameters of Seebeck coefficient (ideally $S(n)=-S(p)$), electrical conductivity (ideally $\sigma(n)=\sigma(p)$), thermal conductivity (ideally $\lambda(n)=\lambda(p)$) and coefficient of thermal expansion (ideally $\alpha(n)=\alpha(p)$).

Proceeding from this prior art and the material requirements mentioned, it is an object of the present invention to provide thermoelectrically active materials which have a high thermoelectric efficiency and exhibit a suitable profile of properties for different application sectors. They should preferably include materials which, within the temperature range under application conditions (typically between ambient temperature and at least 150° C.), do not undergo any change in the mechanism of conduction.

SUMMARY OF THE INVENTION

The object is achieved in accordance with the invention by a
p- or n-conductive semiconductor material comprising a compound of the general formula (I)

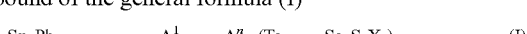
(I)

where
$0.05 < a < 1$
$n \geq 1$ where n is the number of chemical elements different than Sn and Pb
in each case independently
$1\text{ ppm} \leq x1 \ldots xn \leq 0.05$
$A^1 \ldots A^n$ are different from one another and are selected from the group of the elements Li, Na, K, Rb, Cs, Mg, Ca, Y, Ti, Zr, Hf, Nb, Ta, Cr, Mn, Fe, Cu, Ag, Au, Ga, In, Tl, Ge, Sb, Bi
X is F, Cl, Br or I
$0 \leq p \leq 1$
$0 \leq q \leq 1$
$0 \leq r \leq 0.01$
$-0.01 \leq z \leq 0.01$
with the condition that $p+q+r \leq 1$ and $a+x1+\ldots+xn \leq 1$.

BRIEF DESCRIPTION OF THE DRAWINGS

FIG. 2 is a plot of Seebeck coefficient against temperature for a comparative example.

DETAILED DESCRIPTION OF THE INVENTION

Figure 1:
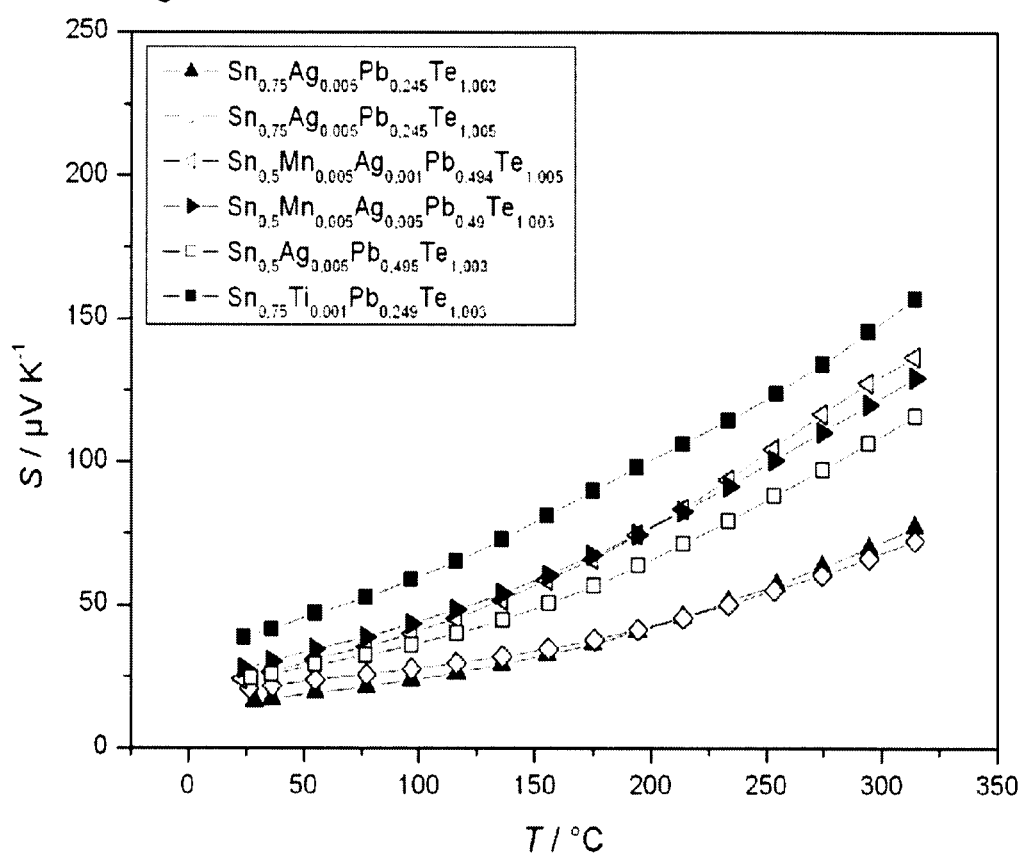
FIG. 1 is a plot of Seebeck coefficient against temperature for an example.

It has been found in accordance with the invention that tin tellurides with a tin content of more than 5% by weight, preferably of at least 10% by weight, especially of at least 20% by weight, have very good thermoelectric properties when they are admixed with at least one additional dopant.

It has additionally been found in accordance with the invention that a change in the mechanism of conduction, for example from p-conduction to n-conduction with rising temperature in the Sn-rich materials, was suppressable. This change is frequently a problem in the Pb-rich systems, since the p-conductive samples, in spite of good start values at room temperature, switch reversibly to the n-conductive region at no higher than 300° C. and are therefore not useful for an application at higher temperatures. This problem can be avoided by using the inventive Sn-rich materials.

In the compounds of the general formula (I), n indicates the number of chemical elements different than SnPb, not including Te, Se, S and X. The materials may be pure tellurides. In this case, $p=q=r=0$. Tellurium may also be replaced partly or completely by selenium, sulfur or, in small amounts, halide. Preferably $0 \leq p \leq 0.2$, more preferably $0 \leq p \leq 0.05$. Preferably $0 \leq q \leq 0.2$, more preferably $0 \leq q \leq 0.05$. More preferably $p=q=r=0$.

n is an integer of at least 1. n preferably has a value of <10, more preferably <5. In particular, n has the value of 1 or 2.

According to the invention, the proportion of tin is $0.05<a<1$. Preferably $0.1 \leq a \leq 0.9$, more preferably $0.15 \leq a \leq 0.8$. In particular, $0.2 \leq a \leq 0.75$.

Each of the different additional elements $A^1$ to $A^n$ is present in an amount of $1\text{ ppm} \leq x1 \ldots xn \leq 0.05$. The sum of $x1 \ldots xn$ is preferably from 0.0005 to 0.1, more preferably from 0.001 to 0.08. The individual values are likewise preferably from 0.0005 to 0.1, more preferably from 0.001 to 0.08.

Examples of preferred compounds are those of the general formula (I) where a=from 0.2 to 0.75, where the sum of $x1 \ldots xn$ is from 0.001 to 0.08 and n has the value of 1 or 2 and $p=q=r=0$ and $z=\pm0.01$. The compounds thus comprise Sn, Pb and Te.

The dopants $A^1 \ldots A^n$ may be selected as desired from the group of the elements Li, Na, K, Rb, Cs, Mg, Ca, Y, Ti, Zr, Hf, Nb, Ta, Cr, Mn, Fe, Cu, Ag, Au, Ga, In, Tl, Ge, Sb, Bi. More preferably, $A^1 \ldots A^n$ are selected from the group of the elements Li, Na, K, Mg, Ti, Zr, Hf, Nb, Ta, Mn, Ag, Ga, In, Ge. In particular, $A^1 \ldots A^n$ are different from one another and are selected from the group of the elements Ag, Mn, Na, Ti, Zr, Ge, Hf.

Particular preference is given in accordance with the invention to p-conductive systems which do not switch from p-conduction to n-conduction even with rising temperature.

For the inventive materials, Seebeck coefficients, for example, in the range from 70 to 202 µV/K were determined for the p-conductive systems. The electrical conductivity was, for example, in the range from 1000 to 5350 S/cm. The power factors which were calculated by way of example were from 18 to 54 µW/K$^2$ cm.

The inventive materials are generally produced by reactive grinding or preferably by co-melting and reaction of mixtures of the particular elemental constituents or alloys thereof. In general, a reaction time for the reactive grinding or preferably co-melting of at least one hour has been found to be advantageous.

The co-melting and reaction is effected preferably over a period of at least 1 hour, more preferably at least 6 hours, especially at least 10 hours. The melting process can be effected with or without mixing of the starting mixture. When the starting mixture is mixed, suitable apparatus for this purpose is especially a rotary or tilting oven, in order to ensure the homogeneity of the mixture.

If no mixing is undertaken, longer melting times are generally required in order to obtain a homogeneous material. If mixing is undertaken, homogeneity in the mixture is obtained at an earlier stage.

Without additional mixing of the starting materials, the melting time is generally from 2 to 50 hours, especially from 30 to 50 hours.

The co-melting is effected generally at a temperature at which at least one constituent of the mixture has already melted. In general, the melting temperature is at least 800° C., preferably at least 950° C. Typically, the melting temperature is within a temperature range from 800 to 1100° C., preferably from 950 to 1050° C.

The cooling of the molten mixture is advantageously followed by the heat treatment of the material at a temperature of generally at least 100° C., preferably at least 200° C., lower than the melting point of the resulting semiconductor material. Typically, the temperature is from 450 to 750° C., preferably from 550 to 700° C.

The heat treatment is preferably carried out over a period of at least 1 hour, more preferably at least 2 hours, especially at least 4 hours. Typically, the heat treatment time is from 1 to 8 hours, preferably from 6 to 8 hours. In one embodiment of the present invention, the heat treatment is performed at a temperature which is from 100 to 500° C. lower than the melting temperature of the resulting semiconductor material. A preferred temperature range is from 150 to 350° C. lower than the melting temperature of the resulting semiconductor material.

The inventive thermoelectric materials are prepared generally in an evacuated and sealed quartz tube. Mixing of the components involved can be ensured by use of a rotatable and/or tiltable oven. On completion of the reaction, the oven is cooled. Thereafter, the quartz tube is removed from the oven and the semiconductor material present in the form of blocks is cut into slices. These slices are then cut into pieces of length about 1 to 5 mm, from which thermoelectric modules can be obtained.

Instead of a quartz tube, it is also possible to use tubes or ampules of other materials which are inert with respect to the semiconductor material, for example of tantalum.

Instead of tubes, it is also possible to use other vessels of a suitable shape. It is also possible to use other materials, for example graphite, as the vessel material, provided that they are inert with respect to the semiconductor material. The materials can also be synthesized by melting/co-melting in an induction oven, for example in graphite crucibles.

In one embodiment of the present invention, the cooled material can be ground wet, dry or in another suitable manner, at a suitable temperature, such that the inventive semiconductor material is obtained in customary particle sizes of less than 10 μm. The ground inventive material is then extruded hot or cold or preferably compressed hot or cold to moldings having the desired form. The density of the moldings pressed in this way should preferably be greater than 50%, more preferably greater than 80%, of the density of the crude material in the unpressed state. Compounds which improve the compaction of the inventive material may be added in amounts of preferably from 0.1 to 5% by volume, more preferably from 0.2 to 2% by volume, based in each case on the powdered inventive material. Additives which are added to the inventive materials should preferably be inert toward the semiconductor material and preferably be discharged from the inventive material during the heating to temperatures below the sintering temperature of the inventive materials, if appropriate under inert conditions and/or reduced pressure. After the pressing, the pressed parts are preferably introduced into a sintering oven in which they are heated to a temperature of preferably not more than 20° C. below the melting point.

The pressed parts are sintered at a temperature of generally at least 100° C., preferably at least 200° C., lower than the melting point of the resulting semiconductor material. The sintering temperature is typically from 350 to 750° C., preferably from 600 to 700° C. It is also possible to carry out spark plasma sintering (SPS) or microwave sintering.

The sintering is performed over a period of preferably at least 0.5 hour, more preferably at least 1 hour, in particular at least 2 hours. Typically, the sintering time is from 0.5 to 5 hours, preferably from 1 to 3 hours. In one embodiment of the present invention, the sintering is performed at a temperature which is from 100 to 600° C. lower than the melting temperature of the resulting semiconductor material. A preferred temperature range is from 150 to 350° C. lower than the melting point of the resulting semiconductor material. The sintering is preferably performed in a reducing atmosphere, for example under hydrogen, or a protective gas atmosphere, for example of argon.

The pressed parts are thus sintered preferably to from 95 to 100% of their theoretical bulk density.

Overall, this gives rise, as a preferred embodiment of the present process according to the invention, to a process which comprises the following process steps:

(1) co-melting mixtures of the particular elemental constituents or alloys thereof with the at least quaternary or ternary compound;
(2) grinding the material obtained in process step (1);
(3) pressing or extruding the material obtained in process step (2) to moldings
and
(4) sintering the moldings obtained in process step (3).

The invention also relates to semiconductor materials obtainable or obtained, i.e. produced, by the processes according to the invention.

The present invention further provides for the use of the above-described semiconductor material and of the semiconductor material obtainable by the above-described process as a thermoelectric generator or Peltier arrangement.

The present invention further provides thermoelectric generators or Peltier arrangements which comprise the above-described semiconductor material and/or the semiconductor material obtainable by the above-described process.

The present invention further provides a process for producing thermoelectric generators or Peltier arrangements, in which thermoelectrically active legs connected in series are used with thin layers of the above-described thermoelectric materials.

The inventive semiconductor materials can be combined to form thermoelectric generators or Peltier arrangements by methods which are known per se to the person skilled in the art and are described, for example, in WO 98/44562, U.S. Pat. No. 5,448,109, EP-A-1 102 334 or U.S. Pat. No. 5,439,528.

The inventive thermoelectric generators or Peltier arrangements generally widen the available range of thermoelectric generators and Peltier arrangements. By varying the chemical composition of the thermoelectric generators or Peltier arrangements, it is possible to provide different systems which satisfy different requirements in a multitude of possible applications. The inventive thermoelectric generators or Peltier arrangements thus widen the range of application of these systems.

The present invention also relates to the use of an inventive thermoelectric generator or of an inventive Peltier arrangement as a heat pump
    for climate control of seating furniture, vehicles and buildings
    in refrigerators and (laundry) driers
    for simultaneous heating and cooling of streams in processes for substance separation such as
        absorption
        drying
        crystallization
        evaporation
        distillation
    as a generator for utilization of heat sources such as
        solar energy
        geothermal heat
        heat of combustion of fossil fuels
        waste heat sources in vehicles and stationary units
        heat sinks in the evaporation of liquid substances
        biological heat sources
    for cooling electronic components.

as a generator for converting thermal energy to electrical energy, for example in motor vehicles, heating systems or power plants The present invention further relates to a heat pump, to a cooler, to a refrigerator, to a (laundry) drier, to a generator for converting thermal energy to electrical energy or to a generator for utilizing heat sources, comprising at least one inventive thermoelectric generator or one inventive Peltier arrangement.

The present invention is illustrated in detail with reference to the examples described below.

EXAMPLES

The materials of the compositions below were always synthesized from the elements or the element tellurides. The purity of the materials used was always 99.99%. The reactants were weighed into a cleaned quartz ampule with an internal diameter of 10 mm, in each case in the appropriate stoichiometric ratio. The amount of sample was in each case 20 g. The ampule was evacuated and sealed by melting. Subsequently, the ampule was heated to 1050° C. in an oven at not more than 500 K h$^{-1}$ and kept at this temperature for 8 hours. During this period, the contents of the ampule were mixed continuously by tilting motions of the oven. After the reaction time, the ampule was cooled to 600° C. in the upright oven position at not more than 100 K h$^{-1}$ and the material was heat treated at this temperature for 24 h. The material was then cooled to room temperature.

The samples were always compact, silvery reguli, which were removed from the ampules and cut into slices of thickness approx. 1.5 mm with a diamond wire saw. The electrical conductivity and the Seebeck coefficient were measured on these slices.

The Seebeck coefficient was determined by placing the material to be analyzed between a hot and a cold contact, the hot contact having had a temperature of 300° C. and the cold side having been kept at room temperature. The voltage measured at the particular temperature difference between hot and cold contact provided the Seebeck coefficient reported in each case.

The electrical conductivity was measured at room temperature by a four-point measurement. The method is known to those skilled in the art.

Table 1 below gives, for different compositions, the Seebeck coefficients S, the electrical conductivity σ and the power factor $S^2\sigma$ calculated therefrom.

investigated. Individual sample slices were analyzed. The procedure was to balance the temperatures of the cold and hot side down to a small interval (ΔT<2 K) and in this way to measure the Seebeck coefficient at an average temperature $((T_{cold}+T_{hot})/2)$.

For comparative purposes, lead tellurides with a high lead content were prepared, and the temperature dependence of the Seebeck coefficient was determined. FIG. 2 shows the corresponding results for different materials. The particular Seebeck coefficient is plotted against the temperature. The measurements confirm that materials with a very high lead content exhibit a switch from p-conduction to n-conduction with rising temperature. The systems therefore do not satisfy the requirements with regard to thermal stability, and the Seebeck coefficient has, depending on the temperature, very low values. In FIG. 2, p-L means p-conduction and n-L means n-conduction.

The invention claimed is:

1. A p- or n-conductive semiconductor material comprising a compound of formula (I)

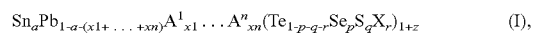

$$Sn_aPb_{1-a-(x1+\ldots+xn)}A^1_{x1}\ldots A^n_{xn}(Te_{1-p-q-r}Se_pS_qX_r)_{1+z} \quad (I),$$

wherein
0.2≤a≤0.75;
n is ≥2, where n is a number of chemical elements different than Sn and Pb;
in each case independently
0.001≤x1, x2, . . . xn≤0.05;
$A^1, A^2, \ldots A^n$ are different from one another, $A^1$ is selected from the group consisting of Ti, Zr, Hf, Mn, Ag, and Ge, and $A^2, \ldots A^n$ are selected from the group consisting of Ti, Zr, and Hf;
X is F, Cl, Br, or I;
0≤p≤1;
0≤q≤1;
0≤r≤0.01; and
−0.01≤z≤0.01,
with the condition that a+x1+x2 . . . +xn<1 and the sum of x1 . . . xn is in the range of 0.002 to 0.1; and
wherein p-type condition does not switch to n-type condition with rising temperature.

2. The semiconductor material according to claim 1, wherein n is 2.

3. The semiconductor material according to claim 2 wherein $A^1 \ldots A^n$ are Zr and Ge.

4. The semiconductor material according to claim 1, wherein p=q=r=0.

TABLE 1

| Example | Formula | S/μV K$^{-1}$ | σ/S cm$^{-1}$ | $S^2\sigma$/μW K$^{-2}$ cm$^{-1}$ |
|---|---|---|---|---|
| 1 | Sn$_{0.2}$Ag$_{0.001}$Mn$_{0.005}$Pb$_{0.794}$Te$_{1.003}$ | 201.8 | 1064.7 | 43.4 |
| 2 | Sn$_{0.5}$Ag$_{0.001}$Mn$_{0.005}$Pb$_{0.494}$Te$_{1.005}$ | 92.6 | 2812.8 | 24.1 |
| 3 | Sn$_{0.25}$Ag$_{0.001}$Mn$_{0.005}$Pb$_{0.744}$Te$_{1.005}$ | 176.4 | 1582.6 | 49.3 |
| 4 | Sn$_{0.54}$Mn$_{0.07}$Na$_{0.01}$Pb$_{0.38}$Te$_{0.99}$ | 131.9 | 1027.8 | 17.9 |
| 5 | Sn$_{0.35}$Ti$_{0.003}$Pb$_{0.647}$Te$_{1.006}$ | 150.1 | 2155.7 | 48.6 |
| 6 | Sn$_{0.75}$Zr$_{0.001}$Ge$_{0.01}$Pb$_{0.489}$Te$_{1.005}$ | 70.2 | 5340.7 | 26.4 |
| 7 | Sn$_{0.5}$Zr$_{0.001}$Ge$_{0.01}$Pb$_{0.489}$Te$_{1.005}$ | 108.6 | 2925.9 | 34.5 |
| 8 | Sn$_{0.75}$Zr$_{0.001}$Pb$_{0.249}$Te$_{1.005}$ | 119.8 | 1430.0 | 20.5 |
| 9 | Sn$_{0.75}$Zr$_{0.01}$Ge$_{0.01}$Pb$_{0.23}$Te$_{1.005}$ | 141.7 | 2655.8 | 53.3 |
| 10 | Sn$_{0.75}$Ag$_{0.005}$Pb$_{0.245}$Te$_{1.003}$ | 84.3 | 4514.4 | 32.1 |

In addition, temperature-resolved measurements of the Seebeck coefficient up to 300° C. were carried out, which are shown in FIG. 1. The particular Seebeck coefficient is plotted against the temperature. The measurements confirm that the Sn-rich materials do not undergo any switch from the p-conductive to the n-conductive type within the temperature range 5. A process for producing a semiconductor material according to claim 1, the method comprising reactively grinding or co-melting mixtures of particular elemental constituents or alloys thereof.

6. The process according to claim 5 comprising co-melting, wherein the co-melting is effected in an induction oven.

7. A process for producing a semiconductor material according to claim 1, comprising:
(1) co-melting mixtures of the particular elemental constituents or alloys thereof with the at least quaternary or ternary compound, to obtain a first material;
(2) grinding the first material obtained in (1), to obtain a second material;
(3) pressing or extruding the second material obtained in (2) to moldings; and
(4) sintering the moldings obtained in (3).

8. A process for producing a semiconductor material according to claim 2, comprising:
(1) co-melting mixtures of the particular elemental constituents or alloys thereof with the at least quaternary or ternary compound, to obtain a first material;
(2) grinding the first material obtained in (1), to obtain a second material;
(3) pressing or extruding the second material obtained in (2) to moldings; and
(4) sintering the moldings obtained in (3).

9. A process for producing a semiconductor material according to claim 4, the method comprising reactively grinding or co-melting mixtures of particular elemental constituents or alloys thereof.

10. The process according to claim 9 comprising co-melting, wherein the co-melting is effected in an induction oven.

11. A process for producing a semiconductor material according to claim 4, comprising:
(1) co-melting mixtures of the particular elemental constituents or alloys thereof with the at least quaternary or ternary compound, to obtain a first material;
(2) grinding the first material obtained in (1), to obtain a second material;
(3) pressing or extruding the second material obtained in (2) to moldings; and
(4) sintering the moldings obtained in (3).

12. A thermoelectric generator or Peltier arrangement comprising a semiconductor material according to claim 1.

13. A heat pump, cooler, refrigerator, (laundry) drier, generator for utilizing heat sources, or generator for converting thermal energy to electrical energy, comprising at least one thermoelectric generator or one Peltier arrangement according to claim 12.

14. A thermoelectric generator or Peltier arrangement comprising a semiconductor material according to claim 4.

15. A heat pump, cooler, refrigerator, (laundry) drier, generator for utilizing heat sources, or generator for converting thermal energy to electrical energy, comprising at least one thermoelectric generator or one Peltier arrangement according to claim 14.

* * * * *